United States Patent
Kim et al.

(10) Patent No.: US 9,602,134 B2
(45) Date of Patent: Mar. 21, 2017

(54) OPERATING METHOD OF ERROR CORRECTION CODE DECODER AND MEMORY CONTROLLER INCLUDING THE ERROR CORRECTION CODE DECODER

(71) Applicant: Samsung Electronics Co., Ltd., Suwon-Si, Gyeonggi-Do (KR)

(72) Inventors: Hyun-Sik Kim, Seoul (KR); Young-Jin Cho, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 81 days.

(21) Appl. No.: 14/314,774

(22) Filed: Jun. 25, 2014

(65) Prior Publication Data

US 2015/0046771 A1  Feb. 12, 2015

(30) Foreign Application Priority Data

Aug. 8, 2013 (KR) .................. 10-2013-0094222

(51) Int. Cl.
| | |
|---|---|
| *H03M 13/11* | (2006.01) |
| *G06F 11/10* | (2006.01) |
| *H03M 13/17* | (2006.01) |
| *H03M 13/37* | (2006.01) |
| *H03M 13/00* | (2006.01) |

(Continued)

(52) U.S. Cl.
CPC ..... *H03M 13/1128* (2013.01); *G06F 11/1068* (2013.01); *H03M 13/1105* (2013.01); *H03M 13/17* (2013.01); *H03M 13/3715* (2013.01); *H03M 13/3738* (2013.01); *H03M 13/6502* (2013.01); *G11C 2029/0411* (2013.01); *H03M 13/152* (2013.01); *H03M 13/1515* (2013.01); *H03M 13/19* (2013.01); *H03M 13/23* (2013.01); *H03M 13/251* (2013.01); *H03M 13/256* (2013.01)

(58) Field of Classification Search
CPC .................. H03M 13/2951; H03M 13/1128
See application file for complete search history.

(56) References Cited

U.S. PATENT DOCUMENTS

| | | | |
|---|---|---|---|
| 5,610,929 A | 3/1997 | Yamamoto | |
| 5,668,815 A * | 9/1997 | Gittinger | G11C 29/48 |
| | | | 714/719 |

(Continued)

FOREIGN PATENT DOCUMENTS

KR  20130006472 A  1/2013

OTHER PUBLICATIONS

Donghyuk Shin; Kyoungwoo Heo; Sangbong Oh; Jeongseok Ha, "A Stopping Criterion for Low-Density Parity-Check Codes," in Vehicular Technology Conference, 2007. VTC2007-Spring. IEEE 65th , vol., No., pp. 1529-1533, Apr. 22-25, 2007.*

*Primary Examiner* — Steve Nguyen
(74) *Attorney, Agent, or Firm* — Harness, Dickey & Pierce, P.L.C.

(57) ABSTRACT

An operating method of an ECC decoder includes receiving first chunk data and second chunk data from a nonvolatile memory device, the second chunk data subsequent to the first chunk data, performing error correction on the first chunk data, determining if the first chunk data includes an uncorrectable error bit and determining not to perform error correction on the second chunk data in response to the first chunk data including the uncorrectable error bit.

10 Claims, 14 Drawing Sheets

(51) Int. Cl.
  *G11C 29/04*   (2006.01)
  *H03M 13/15*   (2006.01)
  *H03M 13/19*   (2006.01)
  *H03M 13/23*   (2006.01)
  *H03M 13/25*   (2006.01)

(56) References Cited

U.S. PATENT DOCUMENTS

| | | |
|---|---|---|
| 6,625,061 B2 | 9/2003 | Higuchi |
| 6,728,927 B2 | 4/2004 | Crozier |
| 6,738,944 B1 | 5/2004 | Kanai |
| 7,434,135 B2 | 10/2008 | Yoshida |
| 8,266,496 B2 | 9/2012 | Flynn et al. |
| 8,392,792 B2 | 3/2013 | Yoon et al. |
| 8,495,432 B2 * | 7/2013 | Dickens ............... G06F 11/073 714/42 |
| 2008/0133999 A1 | 6/2008 | Kondo et al. |
| 2010/0205515 A1 * | 8/2010 | Yang ................. H03M 13/2906 714/800 |
| 2011/0185251 A1 | 7/2011 | d'Abreu et al. |
| 2011/0235415 A1 * | 9/2011 | Park .................... G11C 11/5642 365/185.09 |
| 2012/0278684 A1 | 11/2012 | Eldredge et al. |
| 2013/0139035 A1 * | 5/2013 | Zhong ................ G11C 11/5642 714/773 |
| 2014/0019828 A1 * | 1/2014 | Mihai Ionescu ...... H04L 1/0057 714/776 |
| 2014/0164867 A1 * | 6/2014 | Kaynak .................. G06F 11/10 714/763 |
| 2014/0237162 A1 * | 8/2014 | Brewer .................... G06F 9/38 711/103 |
| 2014/0289559 A1 * | 9/2014 | Hashimoto ............ G11C 29/08 714/27 |

* cited by examiner

FIG. 2A

Page Data (8K)

| 1st Chunk (1K) | 2nd Chunk (1K) | 3rd Chunk (1K) | 4th Chunk (1K) | 5th Chunk (1K) | 6th Chunk (1K) | 7th Chunk (1K) | 8th Chunk (1K) |
|---|---|---|---|---|---|---|---|

FIG. 2B

Chunk Data (1K)

| User data | Parity data |
|---|---|

OPERATING METHOD OF ERROR CORRECTION CODE DECODER AND MEMORY CONTROLLER INCLUDING THE ERROR CORRECTION CODE DECODER

CROSS-REFERENCE TO RELATED APPLICATIONS

This application claims priority from Korean Patent Application No. 10-2013-0094222 filed on Aug. 8, 2013 in the Korean Intellectual Property Office, the disclosure of which is incorporated herein by reference in its entirety.

BACKGROUND

1. Field

Example embodiments relate to a method of operating an error correction code (ECC) decoder and/or a memory controller including the ECC decoder.

2. Description of the Related Art

Memory devices are classified into volatile memory devices and nonvolatile memory devices. The volatile memory devices lose data if the power supply is turned off. The nonvolatile memory devices retain data even if the power supply is turned off.

Examples of the nonvolatile memory devices include read-only memories (ROMs) and electrically erasable programmable read-only memories (EEPROMs).

The structure and operation of flash memory devices introduced as flash EEPROMs are different from those of conventional EEPROMs. A flash memory device may perform an electric erase operation on a block-by-block basis and a program operation on a bit-by-bit basis.

SUMMARY

Some example embodiments provide an error correction code (ECC) decoder capable of improving the error correction speed of a memory controller and an operating method of the ECC decoder.

However, example embodiments are not restricted to the ones set forth herein. Example embodiments will become more apparent to one of ordinary skill in the art to which the example embodiments pertain by referencing the detailed description given below.

According to at least one example embodiment, in response to an uncorrectable error bit being detected from first chunk data, which is a unit of error correction, error correction for second chunk data that is subsequent to the first chunk data is not performed. Accordingly, the time that it takes to decode entire page data can be reduced, and the error correction capability of a memory system can be improved.

According to an example embodiment of inventive concepts, there is provided an operating method of an error correction code (ECC) decoder which uses a low density parity check (LDPC) code, the operating method including, receiving first chunk data and second chunk data from a nonvolatile memory device, the second chunk data subsequent to the first chunk data, performing error correction on the first chunk data, determining whether the first chunk data includes an uncorrectable error bit and determining not to perform error correction on the second chunk data in response to the first chunk data including the uncorrectable error bit.

According to another example embodiment of inventive concepts, there is provided a nonvolatile memory controller, including a microprocessor, and an error correction code (ECC) decoder configured to be connected to the microprocessor via a bus and perform error correction using a low density parity check (LDPC) code. The ECC decoder is further configured to determine whether at least one chunk data in page data includes an uncorrectable error bit determine the whole page data as being uncorrectable if the at least one chunk data includes the uncorrectable error bit and provide an error correction signal to the microprocessor.

An example embodiment discloses a method of operating a nonvolatile memory system. The method includes receiving at least one page of data, the at least one page of data including a plurality of chunks to be decoded, decoding a selected chunk of the plurality of chunks, the selected chunk including at least one error, determining if the at least one error is correctable and generating a stop signal if the at least one error is not correctable, the stop signal terminating error correction of the plurality of chunks

BRIEF DESCRIPTION OF THE DRAWINGS

The above and other features and advantages of the example embodiments will become more apparent by describing in detail some example embodiments with reference to the attached drawings in which:

FIG. 2A is a diagram illustrating page data provided by a nonvolatile memory device, and FIG. 2B is a diagram illustrating chunk data, which is part of a page and a unit of error correction;

DETAILED DESCRIPTION OF EXAMPLE EMBODIMENTS

Figure 1:
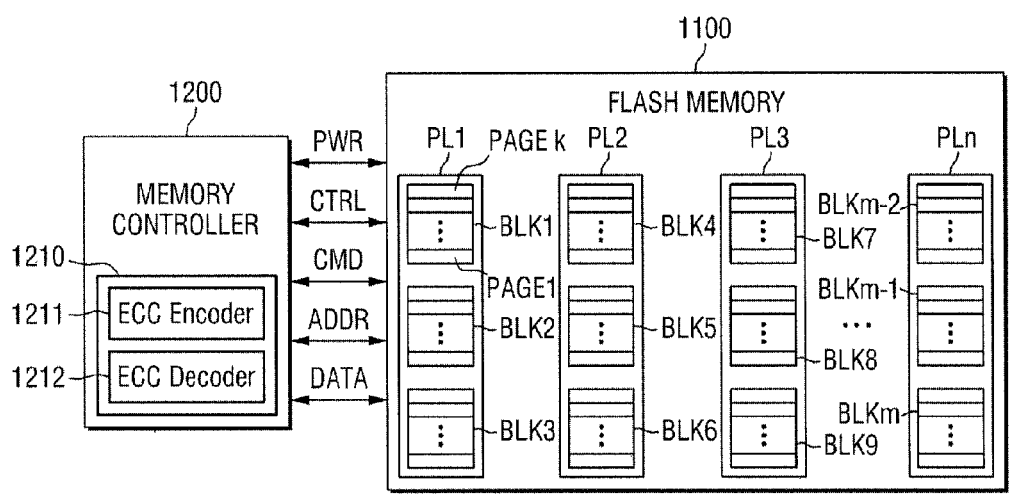
FIG. 1 is a diagram illustrating a nonvolatile memory system according to an example embodiment.

Example embodiments will now be described more fully hereinafter with reference to the accompanying drawings, in which example embodiments of inventive concepts are shown. Example embodiments may, however, be embodied in different forms and should not be construed as limited to the embodiments set forth herein. Rather, these embodiments are provided so that this disclosure will be thorough and complete, and will fully convey the scope of example embodiments to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing example embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which example embodiments belong. It is noted that the use of any and all examples, or exemplary terms provided herein is intended merely to better illuminate example embodiments and is not a limitation on the scope of example embodiments unless otherwise specified. Further, unless defined otherwise, all terms defined in generally used dictionaries may not be overly interpreted.

Example embodiments will be described with reference to perspective views, cross-sectional views, and/or plan views, in which some example embodiments are shown. Thus, the profile of an exemplary view may be modified according to manufacturing techniques and/or allowances. That is, example embodiments are not intended to limit the scope of inventive concepts but cover all changes and modifications that can be caused due to a change in manufacturing process. Thus, regions shown in the drawings are illustrated in schematic form and the shapes of the regions are presented simply by way of illustration and not as a limitation.

FIG. 1 is a diagram illustrating a nonvolatile memory system 1000 according to an example embodiment.

Referring to FIG. 1, the nonvolatile memory system 1000 includes a memory controller 1200 and a nonvolatile memory device 1100.

The memory controller 1200 generally controls the nonvolatile memory device 1100. The nonvolatile memory device 1100 may perform an erase, write or read operation under the control of the memory controller 1200. The nonvolatile memory device 1100 receives a command (CMD), an address (ADDR) and data (DATA) via an input/output (I/O) line. The nonvolatile memory device 1100 receives power (PWR) via a power line, and receives a control signal (CTRL) via a control line. For example, the control signal (CTRL) may include command latch enable (CLE), address latch enable (ALE), chip enable (nCE), write enable (nWE), and read enable (nRE).

The nonvolatile memory device 1100 may include, but is not limited to, a flash memory, an electrically erasable programmable read-only memory (EEPROM), a ferroelectrics random access memory (FRAM), a phase change random access memory (PRAM), and a magneto resistive random access memory (MRAM). In FIG. 1, a NAND flash memory device is illustrated as an example of the nonvolatile memory device 1100. As illustrated in FIG. 1, the nonvolatile memory device 1100 may serve as a storage unit for storing data provided by the memory controller 1200. The nonvolatile memory device 1100 may include a plurality of cell arrays in which to store data. The cell arrays include a plurality of planes PL1 to PLn (where n is a natural number). Each of the planes PL1 to PLn includes a plurality of blocks BLK1 to BLKm (where m is a natural number), and each of the blocks BLK1 to BLKm includes a plurality of pages PAGE1 to PAGEk (where k is a natural number). The blocks BLK1 to BLKm may be units for an erase command, that is, an erase operation may be performed in units of the blocks BLK1 to BLKm. The pages PAGE1 to PAGEk may be units for a program or read command, that is, a program or read operation may be performed in units of the pages PAGE1 to PAGEk.

The blocks BLK1 to BLKm may include user data blocks in which to store regular data provided by a host, single level cell backup blocks from a 3 (or more)-bit multilevel cell (MLC) memory device, or for example, metadata blocks in which to store address mapping information.

An error may occur in memory blocks of a nonvolatile memory device (for example, a flash memory), and such erroneous memory blocks are referred to as bad blocks. Bad blocks may be generated for various reasons, for example, column failure, disturbance, and wear-out.

The memory controller 1200 includes an ECC engine 1210 performing error correction. The ECC engine 1210 includes an ECC encoder 1211 and an ECC decoder 1212. The ECC encoder 1211 performs ECC encoding on data to be programmed into the nonvolatile memory device 1100, thereby generating data with a parity bit added thereto. The parity bit may be stored in the nonvolatile memory device 1100. The ECC decoder 1212 performs ECC decoding on data read from the nonvolatile memory device 1100, makes a determination as to whether the ECC decoding operation has been successful based on the results of the ECC decoding operation and outputs an instruction signal based on the results of the determination. The ECC decoder 1212 may correct one or more error bits in data by using the parity bit obtained by ECC encoding. However, in response to more error bits than a correctable error limit being generated, the ECC engine 1210 can no longer perform error correction, in which case, an error correction failure occurs.

The ECC engine 1210 may perform error correction by using, but not limited to, coded modulation such as a low density parity check (LDPC) code, a Bose-Chaudhuri-Hocquenghem (BCH) code, a turbo code, a Reed-Solomon code, a convolution code, a recursive systematic code (RSC), trellis-coded modulation (TCM), or block coded modulation (BCM).

The ECC engine 1210 may include circuitry, a system or a device for error correction. As described above, in response to the number of error bits generated being greater than a correctable error limit, the ECC engine 1210 may cause an error correction failure. In some example embodiments, in the case of using an LDPC code, the ECC engine 1210 may use log likelihood ratio information, and may repeatedly perform error correction. In a case in which the ECC decoder 1212 corrects error bits in data by using an LDPC code, the error correction capability of the ECC decoder 1212 may be improved, but the time it takes for the ECC decoder 1212 to perform error correction may increase. As a result, in response to the occurrence of a large number of error bits, the error correction speed of the ECC decoder 1212 may rapidly decrease.

The ECC decoder 1212 receives data, in units of pages, from the nonvolatile memory device 1100. A chunk is a unit of error correction, and each of the pages PAGE1 to PAGEk may be divided into a plurality of chunks. The ECC decoder 1212 performs error correction on chunk data.

In some example embodiments, the ECC decoder 1212 may perform error correction on first chunk data, and may not perform error correction on second chunk data in response to an uncorrectable error bit being detected from the first chunk data. That is, if during an error correction operation for a page (for example, the page PAGE1), uncorrectable chunk data is detected from the page PAGE1, the entire error correction operation may be terminated so that other chunk data of the page PAGE1 can no longer be subject to error correction, which will hereinafter be described later with reference to FIGS. 2A to 5.

Figure 2B:
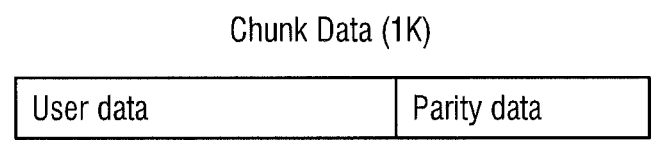

FIG. 2A is a diagram illustrating page data provided by a nonvolatile memory device, and FIG. 2B is a diagram illustrating chunk data, which is part of a page and a unit of error correction.

Referring to FIGS. 1 and 2A, the nonvolatile memory device 1100 provides data (for example, 8-Kbyte data) corresponding to each of the pages PAGE1 to PAGEk to the memory controller 1200.

Referring to FIG. 2A, page data includes a plurality of chunks. For example, page data may be 8-Kbyte data including eight chunks each being 1 Kbyte long.

Referring to FIG. 2B, chunk data includes user data and parity data for ECC decoding. Chunk data is a unit of error correction. The ECC decoder 1212 performs error correction on chunk data.

Figure 3:
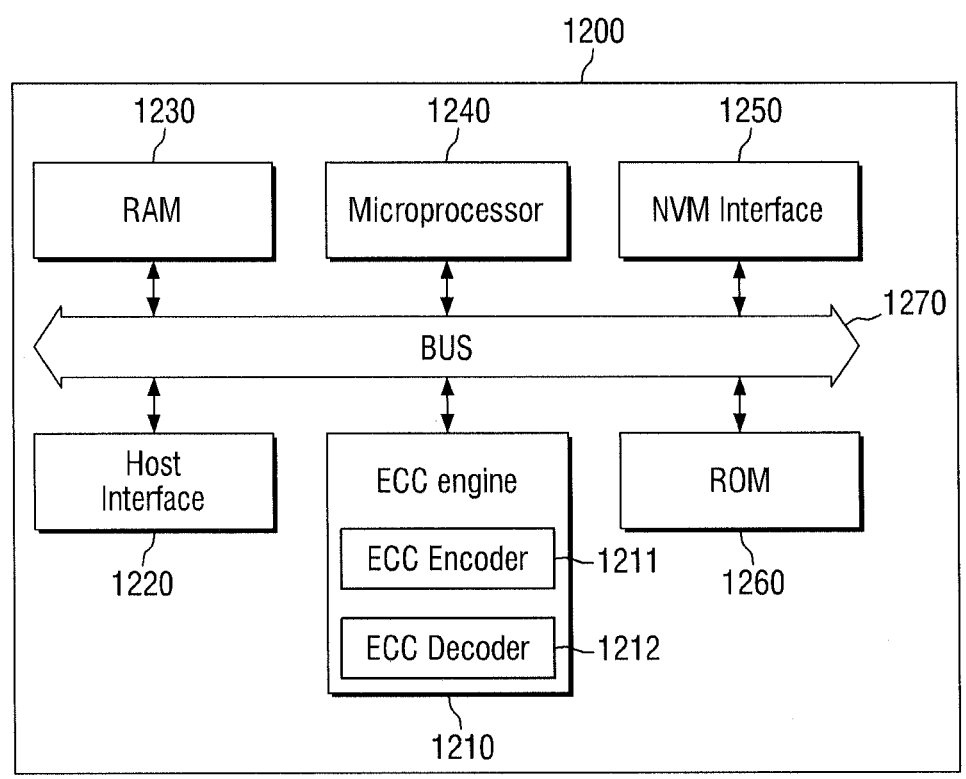
FIG. 3 is a block diagram of a memory controller illustrated in FIG. 1.

FIG. 3 is a block diagram of the memory controller 1200 illustrated in FIG. 1.

Referring to FIG. 3, the memory controller 1200 includes a microprocessor 1240, a random access memory (RAM) 1230, a read-only memory (ROM) 1260, an ECC engine 1210, a host interface 1220 and a nonvolatile memory interface 1250. The ECC engine 1210, the host interface 1220, the RAM 1230, the microprocessor 1240, the nonvolatile memory interface 1250 and the ROM 1260 may be electrically connected to one another via a bus 1270.

The nonvolatile memory interface 1250 may interface between the memory controller 1200 and the nonvolatile memory device 1100.

As illustrated in FIG. 1, various control commands may be provided from the microprocessor 1240 to the nonvolatile memory device 1100 via the nonvolatile memory interface 1250, and data may be transmitted from the memory controller 1200 to the nonvolatile memory device 1100 via the nonvolatile memory interface 1250.

Data output by the nonvolatile memory device 1100 may be provided to the memory controller 1200 via the nonvolatile memory interface 1250.

The host interface 1220 may interface between the memory system 1000 including the memory controller 1200 and a host (not illustrated) in accordance with a predetermined protocol.

The host interface 1220 may communicate with an external host (not illustrated) via Universal Serial Bus (USB), Small Computer System Interface (SCSI), Peripheral Component Interconnect (PCI) Express, Advanced Technology Attachment (ATA), Parallel ATA (PATA), Serial ATA (SATA), or Serial Attached SCSI.

The microprocessor 1240 may be implemented as a circuit, logic, code or a combination thereof. The microprocessor 1240 controls the overall operation of the memory system 1000. In response to power being applied to the memory system 1000, the microprocessor 1240 runs firmware for driving the memory system 1000, which is stored in the ROM 1260, on the RAM 1230, thereby controlling the overall operation of the memory system 1000. The microprocessor 1240 interprets a command applied by a host, and controls the overall operation of the nonvolatile memory device 1100 depending on the results of the interpretation.

The ROM 1260 may store firmware code for driving the memory system 1000, but inventive concepts are not restricted to this. The firmware code may be stored elsewhere in the nonvolatile memory device 1100, for example, in a NAND flash memory device.

Control or intervention of the microprocessor 1240 may include not only direct control of the microprocessor 1240 but also intervention of firmware that is software driven by the microprocessor 1240.

The ROM 1260 may store a parity check matrix, which is used by the ECC engine 1210. The parity check matrix will be described later in further detail.

The RAM 1230 is a memory serving as a buffer and may store initial commands, data and variables input via the host interface 1220, data output from the nonvolatile memory device 1100 and data, parameters and variables input to the nonvolatile memory device 1100.

The ECC engine 1210 performs error correction. The ECC engine 1210 includes the ECC encoder 1211 and the ECC decoder 1212. The ECC encoder 1211 and ECC decoder 1212 may be hardware, firmware, hardware executing software or any combination thereof. When at least one of the ECC encoder 1211 and the ECC decoder 1212 are hardware, such existing hardware may include one or more Central Processing Units (CPUs), digital signal processors (DSPs), application-specific-integrated-circuits (ASICs), field programmable gate arrays (FPGAs) computers or the like configured as special purpose machines to perform the functions of the ECC encoder 1211 and/or the ECC decoder 1212. CPUs, DSPs, ASICs and FPGAs may generally be referred to as processors and/or microprocessors.

In the event where at least one of the ECC encoder 1211 and ECC decoder 1212 is a processor executing software, the ECC engine 1210 and/or the microprocessor 1240 are configured as special purpose machines to execute the software to perform the functions of the at least one of the ECC encoder 1211 and ECC decoder 1212. In such an embodiment, the ECC engine 1210 may include one or more Central Processing Units (CPUs), digital signal processors (DSPs), application-specific-integrated-circuits (ASICs), field programmable gate arrays (FPGAs) computers.

The ECC encoder 1211 performs ECC encoding on data input thereto via the host interface 1220 of the memory system 1000, thereby generating a codeword with a parity bit added thereto. The codeword may be stored in the nonvolatile memory device 1100.

The ECC decoder 1212 performs ECC decoding on output data, makes a determination as to whether the ECC decoding of the output data has been successful based on the results of the ECC decoding, and outputs an instruction signal based on the results of the determination. Read data is transmitted to the ECC decoder 1212, and the ECC decoder 1212 may correct any error bit in the read data by using a parity bit. If more error bits than a correctable error limit are generated, the ECC decoder 1212 can no longer perform error correction, and as a result, an error correction failure occurs.

The ECC engine 1210 may use various codes, as already discussed above with reference to FIG. 1. With respect to the description that follows, it is assumed that the ECC engine 1210 uses an LDPC code. The ECC engine 1210 may have a parity check matrix H that satisfies the following equation:

$$S=Hc^T=0 \tag{1}$$

where S indicates syndrom, and $c^T$ is a transposed matrix of a codeword c.

The ECC decoder 1212 uses a parity check matrix to perform error correction on data provided by the nonvolatile memory device 1100. The ECC decoder 1212 may receive hard-decision data or soft-decision data, which is probability data added to the hard-decision data, from the nonvolatile memory device 1100. The ECC decoder 1212 may perform error correction using the soft-decision data when error correction using the hard-decision data fails.

The ECC decoder 1212 may receive data, in units of pages, from the nonvolatile memory device 1100. The ECC decoder 1212 performs error correction in units of chunks. As discussed above with reference to FIG. 2, page data may include a plurality of chunk data. For example, a page may be 8-Kbyte data, and may include eight chunk data each being 1 Kbyte long.

The ECC decoder 1212 performs error correction on first chunk data, and does not perform error correction on second chunk data that is subsequent to the first chunk data, if there is any uncorrectable error bit in the first chunk data. The ECC decoder 1212 provides a correction failure signal or an uncorrectable error signal, and at the same time, an error correction stop signal, to the microprocessor 1240. For example, if the page data provided by the nonvolatile memory device 1100 is hard-decision page data and an error correction operation for the hard-decision page data fails, the microprocessor 1240 terminates the whole error correction operation for the hard-decision page data, and gives instructions to the nonvolatile memory device 1100 to provide soft-decision page data. The ECC decoder 1212 performs error correction on the soft-decision page data. Then, if error correction for a first chunk of the soft-decision page data fails, the microprocessor 1240 may perform, for example, a read retry operation, i.e., may read data again from the nonvolatile memory device 1100 by changing a read voltage. During the read retry operation, a read operation may be performed again on the nonvolatile memory device 1100 by applying a voltage lower than the read voltage used to read out the hard-decision page data and the soft-decision page data.

If error correction is not terminated even in response to the detection of an uncorrectable error bit, the following problem may arise. The ECC decoder 1212, which uses an LDPC code, performs iterations of error correction. If there still exists an uncorrectable error bit in the first chunk data even after a number of (for example, twenty) iterations of error correction corresponding to an iteration limit, the ECC decoder 1212 may perform as many or more iterations of error correction on the second chunk data that is subsequent to the first chunk data, and it is highly likely that the second chunk data also includes an uncorrectable error bit. To address this problem, if the first chunk data, which is part of the page data provided by the nonvolatile memory device 1100, is uncorrectable, the ECC decoder 1212 provides an uncorrectable error signal, which indicates that the whole page data including the first chunk data is uncorrectable, and an error correction stop signal to the microprocessor 1240 without continuing to perform error correction on the second chunk data. The term "first chunk data", as used herein, may indicate any arbitrary chunk data of page data, and does not necessarily indicate the chunk data that physically comes first in the page data.

Figure 4:
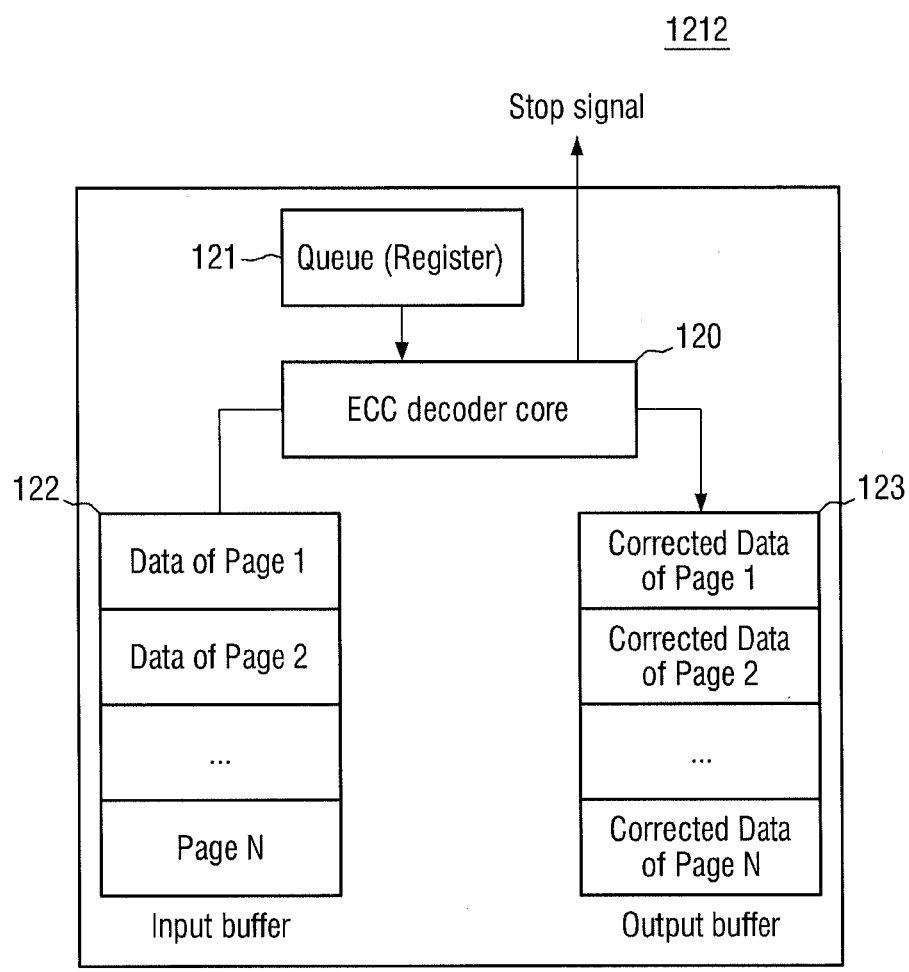
FIG. 4 is a block diagram of an example of an ECC decoder illustrated in FIGS. 1 and 3.

FIG. 4 is a block diagram of an example of the ECC decoder 1212 illustrated in FIGS. 1 and 3.

Referring to FIG. 4, the ECC decoder 1212 is an ECC decoder using an LDPC code. The ECC decoder 1212 includes an ECC decoder core 120, a queue 121, an input buffer 122 and an output buffer 123. The ECC decoder core 120 performs error correction on data in units of chunks by using an LDPC code.

The input buffer 122 temporarily stores page data provided by the nonvolatile memory device 1100. The input buffer 122 provides part of the page data, i.e., a chunk, to the ECC decoder core 120. The output buffer 123 stores error-corrected data provided by the ECC decoder core 120, and provides the error-corrected data to the nonvolatile memory device 1100 for a page-by-page programming. The ECC decoder core 120 has excellent error correction capability, but may be slow in speed due to the iterations of the operation thereof. That is, when there are a large number of error bits, the ECC decoder core 120 may become slow in speed, and may thus adversely affect the performance of the whole nonvolatile memory system 1000. Accordingly, the ECC decoder 1212 may be configured to be equipped with buffers with large storage capacity, i.e., the input buffer 122 and the output buffers 123, so as not to influence the performance of the nonvolatile memory system 1000.

The queue 121, which is a register, stores data size and address information. For example, the queue 121 stores the size and address of each chunk data. The queue 121 provides the size and address of each chunk data to the ECC decoder 120.

The ECC decoder core 120 receives first chunk data from the input buffer 122, and performs error correction on the first chunk data using an LDPC code. In response to an error correction failure occurring due to the presence of an uncorrectable error bit in the first chunk data, the ECC decoder core 120 provides an error correction stop signal and an uncorrectable error signal to the microprocessor 1240. As a result, no error correction is performed on second chunk data that is subsequent to the first chunk data, and the whole error correction operation for the page data provided by the nonvolatile memory device 1100 is terminated.

The first chunk data and the second chunk data are unit data for error correction, and each account for part of the page data provided by the nonvolatile memory device 1100. The first chunk data and the second chunk data may be hard- or soft-decision data. In response to the first chunk data and the second chunk data both being hard-decision chunk data and the first chunk data including an uncorrectable error bit, error correction for the first and second hard-decision chunk data is terminated. Then, the memory controller 1200 receives soft-decision chunk data from the nonvolatile memory device 1100, and the ECC decoder 1212 performs error correction on soft-decision chunk data. That is, in response to an uncorrectable error bit being generated in the first hard-decision chunk data, the ECC decoder 1212 terminates an ECC decoding operation for the whole page data including the first hard-decision chunk data, is provided with soft-decision data, and performs error correction on the soft-decision data. Similarly, if first chunk data of the soft-decision data also includes an uncorrectable error bit, the ECC decoder 1212 terminates an ECC decoding operation for the whole soft-decision data. That is, in response to a first chunk of page data being uncorrectable, the ECC decoder 1212 terminates an ECC decoding operation for the whole page data without continuing to perform error correction on a second chunk of the page data, regardless of whether the page data is hard- or soft-decision data, and proceeds to subsequent page data to perform ECC decoding. When a first chunk of page data is an ECC failure, the rest of the whole page data is highly likely to be an ECC failure. In this example, the ECC decoder 1212 can reduce the time that it takes to perform error correction by not continuing to perform error correction on the rest of the page data. The term "first chunk data", as used herein, may indicate any arbitrary chunk data of page data, and does not necessarily indicate the chunk data that physically comes first in the page data.

Figure 5:
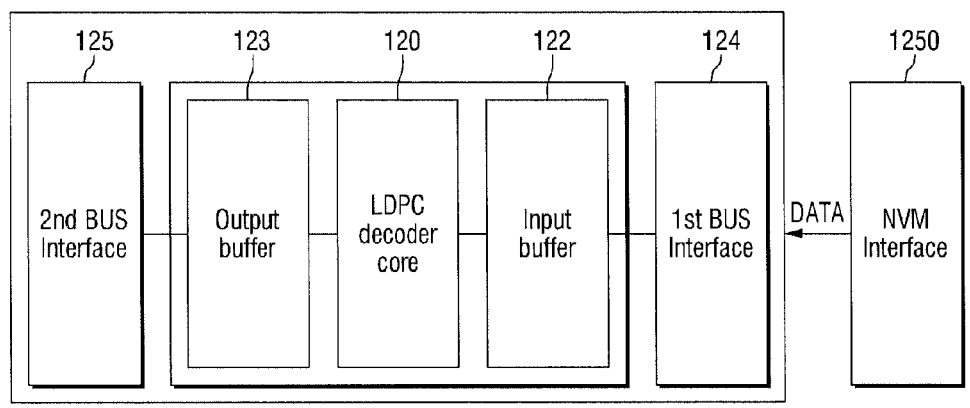
FIG. 5 is a block diagram of another example of the ECC decoder illustrated in FIGS. 1 and 3.

FIG. 5 is a block diagram of another example of the ECC decoder 1212 illustrated in FIGS. 1 and 3.

Referring to FIG. 5, the ECC decoder 1212, like its counterpart in FIG. 4, includes an ECC decoder 120, an input buffer 122 and an output buffer 123. The ECC decoder 1212 also includes first and second ECC bus interfaces 124 and 125, which are independent from the nonvolatile memory device interface 1250. The ECC decoder core 120 is slower in processing speed than the nonvolatile memory device interface 1250, and may deteriorate the performance of the memory controller 1200. To prevent this problem, the first and second ECC buses 124 and 125 may be provided that separate the ECC decoder core 120 and the nonvolatile memory device interface 1250. The processing speed of the first and second buses 124 and 125 is different from the processing speed of the nonvolatile memory device interface 1250. The first and second ECC buses 124 and 125 are connected to the input and output buffers 122 and 123, respectively.

Page data provided by the nonvolatile memory device 1100 is provided to the first ECC bus 124 via the nonvolatile memory device interface 1250, and then to the input buffer 122 via the first ECC bus 124. The ECC decoder core 120 receives first chunk data of the page data from the input buffer 122 and performs error correction on the first chunk data by using an LDPC code. If an error correction failure occurs due to the presence of an uncorrectable error bit in the first chunk data, the ECC decoder core 120 provides an uncorrectable error signal and an error correction stop signal to the microprocessor 1240 so that error correction for the whole page data is terminated without continuing to perform error correction on second chunk data that is subsequent to the first chunk data. The term "first chunk data", as used herein, may indicate any arbitrary chunk data of page data, and does not necessarily indicate the chunk data that physically comes first in the page data.

Figure 6:
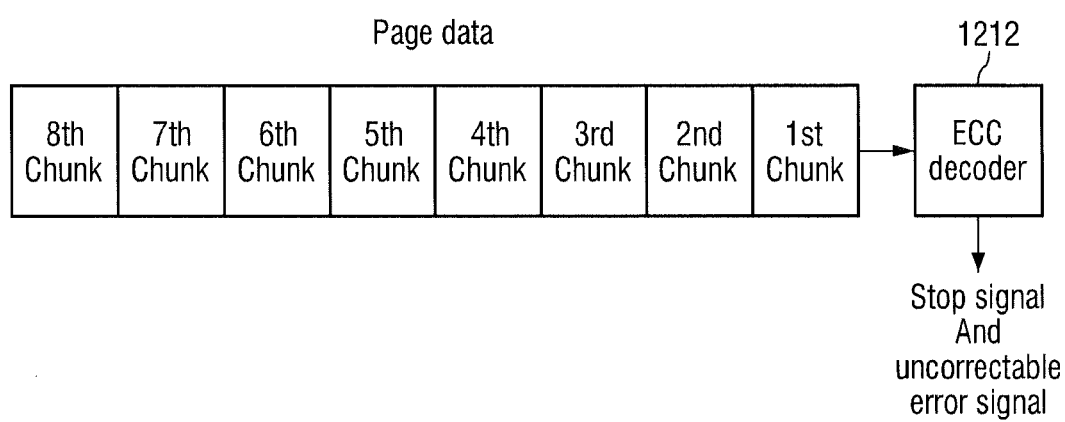
FIG. 6 is a diagram illustrating an operation of an ECC decoder according to an example embodiment.

FIG. 6 is a diagram illustrating an operation of the ECC decoder 1212 according to an example embodiment.

Referring to FIG. 6, page data includes, for example, eight chunk data, i.e., first to eighth chunk data. The first to eighth chunk data are sequentially provided to the ECC decoder 1212. The ECC decoder 1212 performs error correction on the first chunk data. The ECC decoder 1212 provides an uncorrectable error signal and an error correction stop signal to the microprocessor 1240 upon detecting an uncorrectable error bit in the first chunk data. As a result, no error correction is performed on the second chunk data that is subsequent to the first chunk data, and an error correction operation for the whole page data is terminated.

The term "first chunk data", as used herein, may indicate any arbitrary chunk data of page data, and does not necessarily indicate the chunk data that physically comes first in the page data.

If error correction is not terminated even in response to the detection of an uncorrectable error bit, the following problem may arise. The ECC decoder 1212, which uses an LDPC code, performs iterations of error correction. If there still exists an uncorrectable error bit in the first chunk data even after a number of (for example, twenty) iterations of error correction corresponding to an iteration limit, the ECC decoder 1212 may perform as many or more iterations of error correction on the second chunk data that is subsequent to the first chunk data, and it is highly likely that the second chunk data also includes an uncorrectable error bit. To address this problem, if the first chunk data, which is part of the page data provided by the nonvolatile memory device 1100, is uncorrectable, the ECC decoder 1212 provides an uncorrectable error signal, which indicates that the whole page data including the first chunk data is uncorrectable, and an error correction stop signal to the microprocessor 1240 without continuing to perform error correction on the second chunk data.

Figure 7:
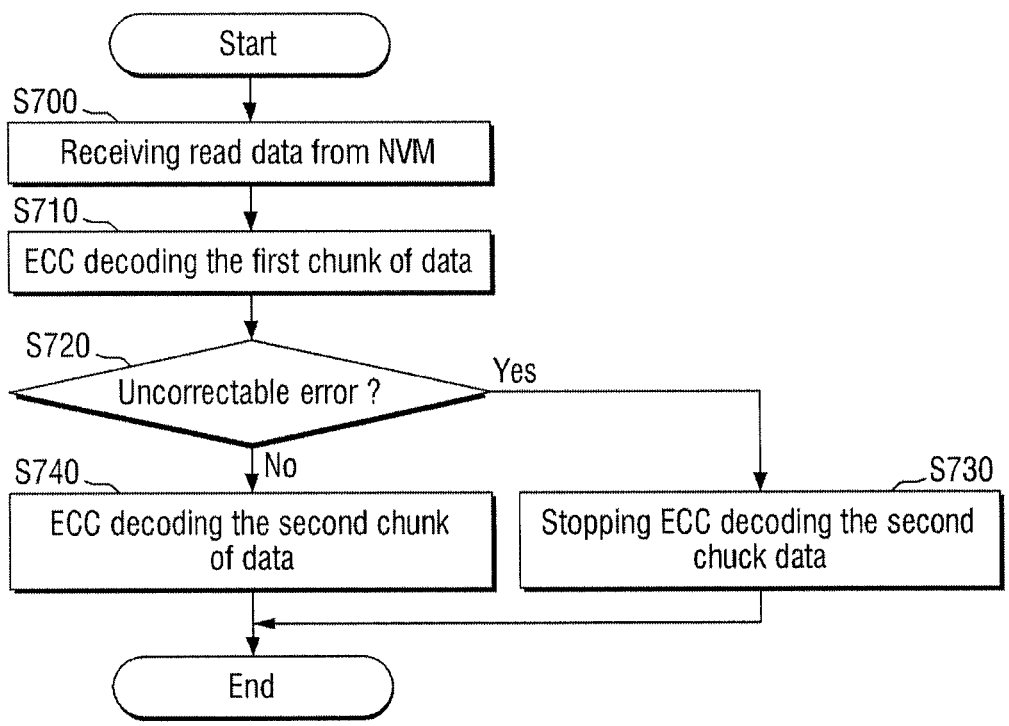
FIG. 7 is a flowchart illustrating an operation of a nonvolatile memory system according to an example embodiment.

FIG. 7 is a flowchart illustrating an operation of a nonvolatile memory system according to an example embodiment.

Referring to FIG. 7, an ECC decoder receives read data from a nonvolatile memory device (S700). The ECC decoder performs ECC decoding on a chunk of the read data, which is a unit of ECC decoding, for example, first chunk data, by using AN LDPC code (S710). If the results of the ECC decoding show that there is an uncorrectable error bit in the first chunk data (S720), the ECC decoder terminates the ECC decoding for second chunk data that is subsequent to the first chunk data (S730). If the results of the ECC decoding show that there is no uncorrectable error bit in the first chunk data (S720), the ECC decoder continues to perform ECC decoding on the second chunk (S740). That is, the ECC decoder uses an LDPC code to perform error correction. If the first chunk data, which is unit data for ECC decoding, includes an uncorrectable error bit, the ECC decoder does not perform error correction on the second chunk data. By not continuing to perform error correction on the second chunk data, it is possible to reduce the time that it takes to decode the whole page data, and to improve the performance of the ECC decoder and the whole memory system.

Figure 8:
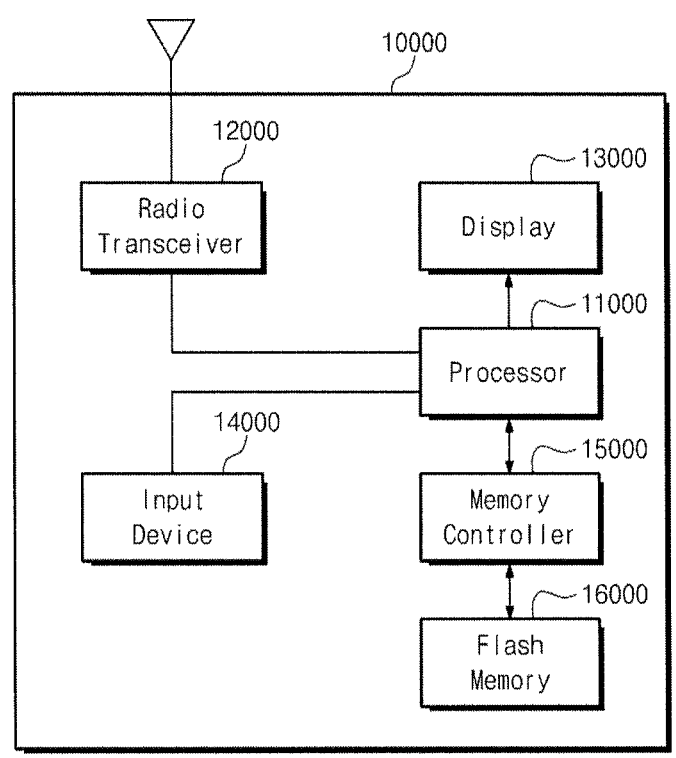
FIG. 8 is a block diagram of an electronic device including a memory controller and a nonvolatile memory device according to an example embodiment.

FIG. 8 is a block diagram of an electronic device 10000 including a memory controller 15000 and a nonvolatile memory device 16000 according to an example embodiment.

Referring to FIG. 8, the electronic device 10000, such as a cellular phone, a smart phone, or a tablet personal computer (PC), may include the nonvolatile memory device 16000, which can be implemented as a flash memory device, and the memory controller 15000, which can control the operation of the nonvolatile memory device 16000.

The nonvolatile memory device 16000 may be the same as the nonvolatile memory device 1100 of FIG. 1. The nonvolatile memory device 16000 may store random data.

The memory controller 15000 is controlled by a processor 11000 that controls the overall operation of the electronic device 10000.

Data stored in the nonvolatile memory device 16000 may be displayed on a display 13000 under the control of the memory controller 15000 that operates under the control of the processor 11000.

A radio transceiver 12000 may transmit or receive a radio signal via an antenna ANT. For example, the radio transceiver 12000 may convert a radio signal received via the antenna ANT into a signal that can be processed by the processor 11000. Then, the processor 11000 may process the signal output from the radio transceiver 12000 and may store the processed signal in the nonvolatile memory device 16000 or display the processed signal on the display 13000 under the control of the memory controller 15000.

The radio transceiver 12000 may convert the signal output from the processor 11000 into a radio signal, and may output the radio signal to the outside through the antenna ANT.

An input device 14000 is a device for entering a control signal for controlling the operation of the processor 11000 or data to be processed by the processor 11000. The input device 14000 may be implemented as a pointing device such as a touch pad or a computer mouse, a keypad, or a keyboard.

The processor 11000 may control the display 13000 to display data output from the nonvolatile memory device 16000, a radio signal output from the radio transceiver 12000, or data output from the input device 13000.

The processor 11000 may control the display 13000 to display data output from the nonvolatile memory device 16000, a radio signal output from the radio transceiver 12000, or data output from the input device 14000.

Figure 9:
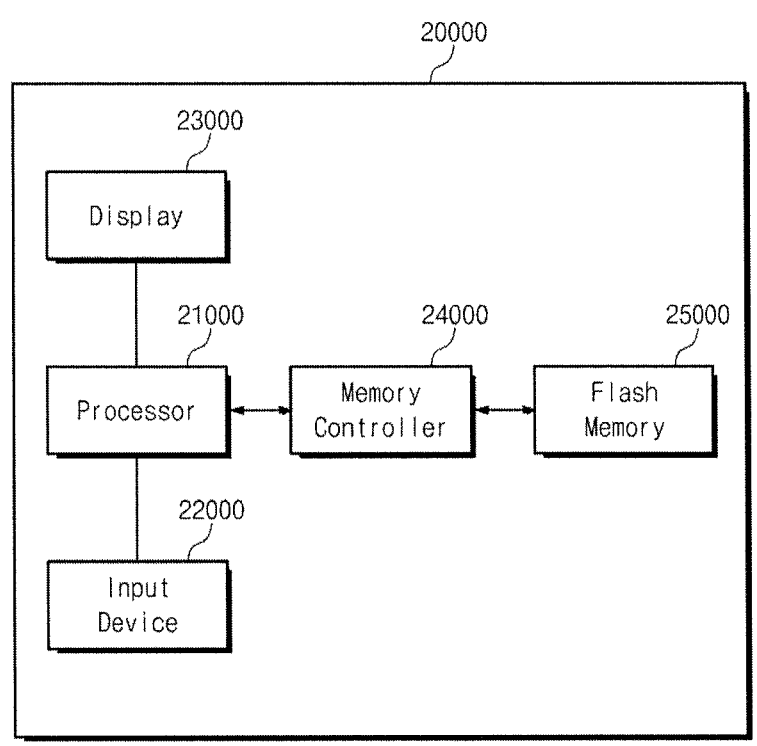
FIG. 9 is a block diagram of an electronic device including a memory controller and a nonvolatile memory device according to another example embodiment.

FIG. 9 is a block diagram of an electronic device 20000 including a memory controller 24000 and a nonvolatile memory device 25000 according to another example embodiment.

Referring to FIG. 9, the electronic device 20000, which can be implemented as a data processing device such as PC, a tablet computer, a netbook, an e-reader, a personal digital assistant (PDA), a portable multimedia player (PMP), an MP3 player, or an MP4 player, includes the nonvolatile memory device 25000 such as a flash memory device and the memory controller 24000, which can control the operation of the nonvolatile memory device 25000.

The nonvolatile memory device 25000 may be the same as the nonvolatile memory device 1100 or 16000 of FIG. 1 or 8. The nonvolatile memory device 25000 may store random data.

The electronic device 20000 may also include a processor 21000 for controlling the overall operation of the electronic device 20000. The memory controller 24000 is controlled by the processor 21000.

The processor 21000 may display data stored in the nonvolatile memory device 25000 on a display 23000 in accordance with an input signal generated by an input device 22000. For example, the input device 22000 may be implemented as a pointing device such as a touch pad or a computer mouse, a keypad, or a keyboard.

Figure 10:
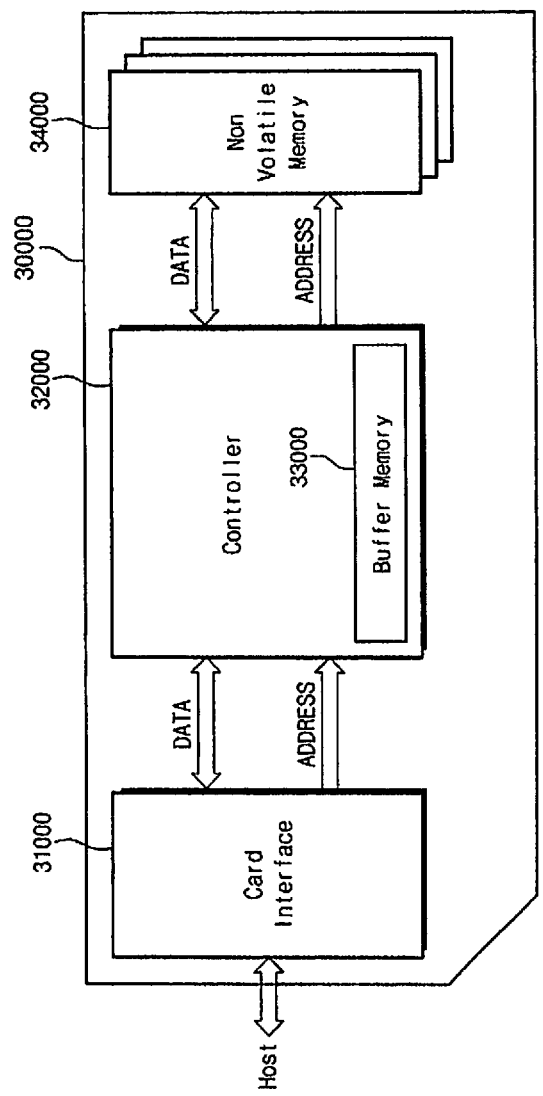
FIG. 10 is a block diagram of an electronic device including a nonvolatile memory device, according to another example embodiment.

FIG. 10 is a block diagram of an electronic device 30000 including a nonvolatile memory device 34000 according to another example embodiment.

Referring to FIG. 10, the electronic device 30000 includes a card interface 31000, a memory controller 32000, and the nonvolatile memory device 34000, for example, a flash memory device.

The electronic device 30000 may transmit data to or receive data from a host via the card interface 31000. In an example embodiment, the card interface 31000 may be, but is not limited to, a secure digital (SD) card interface or a multi-media card (MMC) interface. The card interface 31000 may interface between the memory controller 32000 and a host that can communicate with the electronic device 30000, for the exchange of data therebetween, in accordance with a communication protocol of the host.

The memory controller 32000 may control the overall operation of the electronic device 30000, and may also control the exchange of data between the card interface 31000 and the nonvolatile memory device 34000. The memory controller 32000 includes a buffer memory 33000 which buffers data transmitted between the card interface 31000 and the nonvolatile memory device 34000.

The memory controller 32000 is connected to the card interface 31000 and the nonvolatile memory device 34000 via a data bus DATA and an address ADDRESS. The memory controller 32000 may receive the address of data to be read or written from the card interface 31000 via the address bus ADDRESS and transmit the received address to the nonvolatile memory device 34000.

The memory controller 32000 may transmit or receive data to be read or written via the data bus DATA, which is connected to the card interface 31000 or the nonvolatile memory device 34000.

The nonvolatile memory device 34000 may be the same as the nonvolatile memory device 1100 of FIG. 1. The nonvolatile memory device 34000 may store random data.

When the electronic device 30000 is connected to the host, such as a PC, a tablet PC, a digital camera, a digital audio player, a cellular phone, a console video game hardware, or a digital set top box, the host may transmit data to or receive data from the nonvolatile memory device 34000 via the card interface 31000 or the memory controller 32000.

Figure 11:
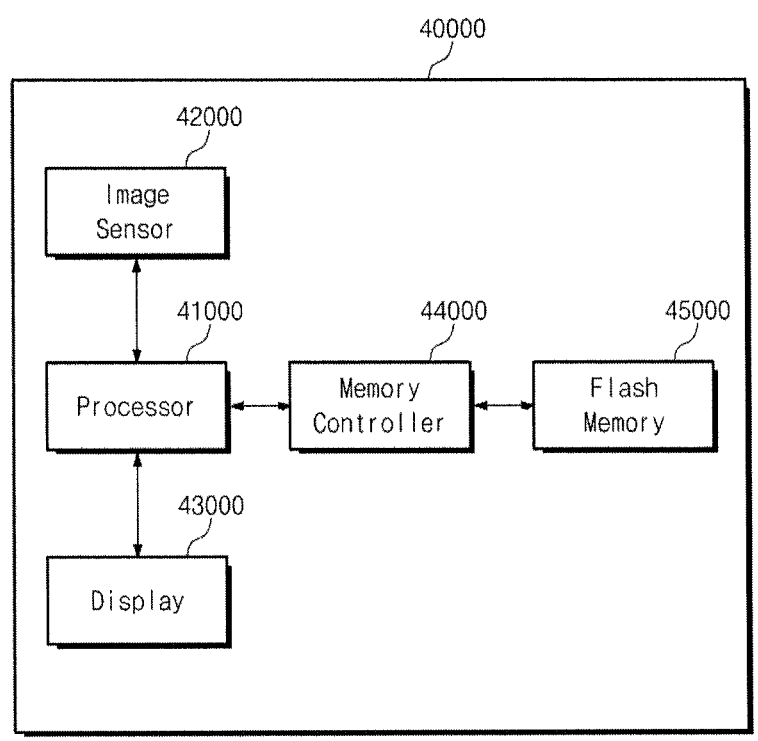
FIG. 11 is a block diagram of an electronic device including a memory controller and a nonvolatile memory device according to another example embodiment.

FIG. 11 is a block diagram of an electronic device 40000 including a memory controller 44000 and a nonvolatile memory device 45000 according to another example embodiment.

Referring to FIG. 11, the electronic device 40000 includes the nonvolatile memory device 45000, such as a flash memory device, the memory controller 44000 for controlling the data processing operation of the nonvolatile memory device 45000, and an image sensor 41000 for controlling the overall operation of the electronic device 40000.

The nonvolatile memory device 45000 may be the same as the nonvolatile memory device 1100 of FIG. 1.

The image sensor 42000 converts an optical signal into a digital signal. The digital signal is either stored in the nonvolatile memory device 45000 or displayed on a display 43000 under the control of the image sensor 42000. A digital signal stored in the nonvolatile memory device 45000 may also be displayed on the display 43000 under the control of the image sensor 42000.

Figure 12:
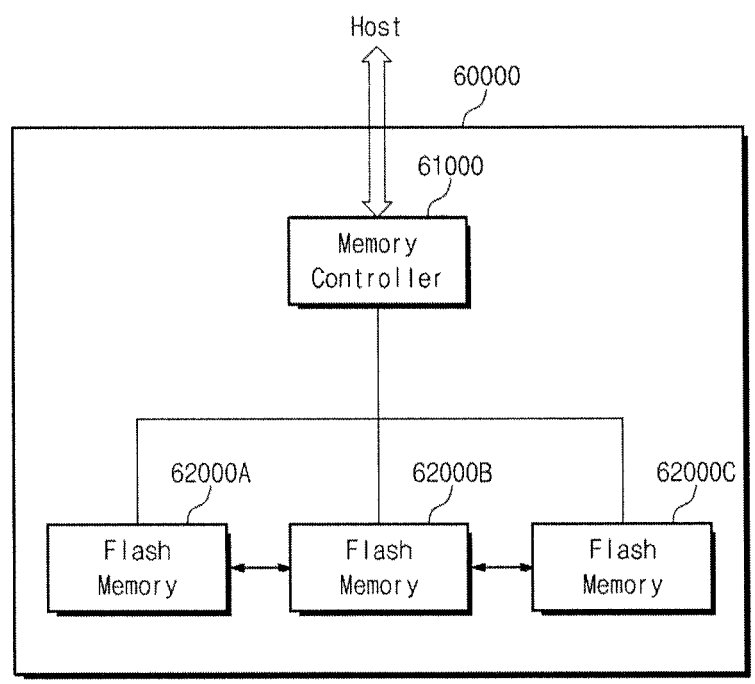
FIG. 12 is a block diagram of an electronic device including a memory controller and nonvolatile memory devices according to another example embodiment.

FIG. 12 is a block diagram of an electronic device 60000 including a memory controller 61000 and nonvolatile memory devices 62000A, 62000B and 62000C according to another example embodiment.

Referring to FIG. 12, the electronic device 60000 may be implemented as a data storage device such as a solid state drive (SSD).

The electronic device 60000 may include the nonvolatile memory devices 62000A, 62000B and 62000C and the memory controller 61000, which can control the data processing operation of each of the nonvolatile memory devices 62000A, 62000B and 62000C.

The electronic device 60000 may be implemented as a memory system or a memory module.

Each of the nonvolatile memory devices 62000A, 62000B and 62000C may be the same as the nonvolatile memory device 1100 of FIG. 1. The nonvolatile memory devices 62000A, 62000B and 62000C may store random data.

In an example embodiment, the memory controller 61000 may be implemented in or outside the electronic device 60000.

Figure 13:
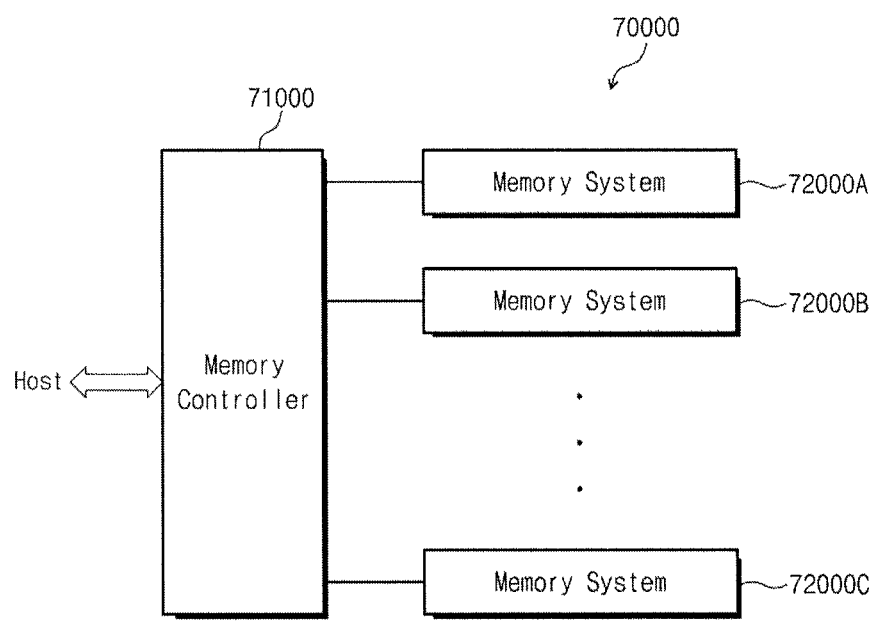
FIG. 13 is a block diagram of a data processing system including the electronic device illustrated in FIG. 12.

FIG. 13 is a block diagram illustrating a data processing system 70000 including an example of the electronic device 60000 illustrated in FIG. 12.

Referring to FIGS. 12 and 13, the data processing system 70000, which can be implemented as a Redundant Array of Independent Disks (RAID) system, may include a RAID controller 71000 and a plurality of memory systems 72000A, 72000B, . . . , 72000N (where N is a natural number).

Each of the memory systems 72000A, 72000B, . . . , 72000N may be the same as the electronic device 30000 of FIG. 10. The memory systems 72000A, 72000B, . . . , 72000N may form a RAID. The data processing device 70000 may be implemented as a PC or a SSD.

During a program operation, the RAID controller 71000 may output program data output from a host to one of the memory systems 72000A, 72000B, . . . , 72000N corresponding to an RAID level selected from a plurality of RAID levels based on RAID level information provided by the host.

During a read operation, the RAID controller 71000 may transmit, to the host, data read from one of the memory systems 72000A, 72000B, . . . , 72000N in accordance with an RAID level selected from the plurality of RAID levels based on the RAID level information provided by the host.

While the present inventive concept has been particularly shown and described with reference to example embodiments thereof, it will be understood by those of ordinary skill in the art that various changes in form and detail may be made therein without departing from the spirit and scope of the present inventive concept as defined by the following claims. Example embodiments should be considered in a descriptive sense only and not for purposes of limitation.

What is claimed is:

1. An operating method of an error correction code (ECC) decoder which uses a low density parity check (LDPC) code, the operating method comprising:
   reading first chunk data of hard-decision data and second chunk data of the hard-decision data from a nonvolatile memory device using a read voltage, the second chunk data received subsequent to the first chunk data;
   performing error correction on the first chunk data;
   determining if the first chunk data includes an uncorrectable error bit;
   determining not to perform error correction on the second chunk data if the first chunk data is determined to include the uncorrectable error bit;
   obtaining third chunk data of soft-decision data and fourth chunk data of the soft-decision data in response to the hard-decision data including the uncorrectable error bit, the fourth chunk data obtained subsequent to the third chunk data;
   determining if the third chunk data includes the uncorrectable error bit;
   determining not to perform error correction on the fourth chunk data if the third chunk data is determined to include the uncorrectable error bit;
   adjusting the read voltage;
   reading fifth chunk data of the hard-decision data and sixth chunk data of the hard-decision data from the nonvolatile memory device using the adjusted read voltage, the fifth chunk data of the hard-decision data corresponding to the first chunk data of the hard-decision data and the sixth chunk data of the hard-decision data corresponding to the second chunk data of the hard-decision data;
   performing error correction on the fifth chunk data;
   determining if the fifth chunk data includes the uncorrectable error bit; and
   determining not to perform error correction on the sixth chunk data if the fifth chunk data is determined to include the uncorrectable error bit.

2. The operating method of claim 1, wherein the first chunk data and the second chunk data are in a single page.

3. The operating method of claim 1, wherein the first chunk data is a unit of error correction.

4. The operating method of claim 1, further comprising:
   storing the first chunk data and the second chunk data in an input buffer.

5. The operating method of claim 1, further comprising:
   providing an uncorrectable error signal to a microprocessor in response to the third chunk data including the uncorrectable error bit.

6. The operating method of claim 1, further comprising:
   providing an error correction stop signal to a microprocessor in response to the third chunk data including the uncorrectable error bit, the error correction stop signal for terminating error correction for the fourth chunk data.

7. The operating method of claim 1, wherein the first chunk data and the second chunk data are in a single page, and the operating method further comprises:
   terminating error correction of the hard-decision data for the single page in response to the first chunk data including the uncorrectable error bit.

8. The operating method of claim 1, wherein the nonvolatile memory device and the ECC decoder have bus interfaces with different processing speeds.

9. The operating method of claim 1, further comprising:
   storing address information and data size information of the first chunk data and the second chunk data in a queue.

10. A method of operating a nonvolatile memory system, the method comprising:
    receiving at least one page of data, the at least one page of data including a plurality of chunks to be decoded;
    decoding a selected chunk of the plurality of chunks, the selected chunk including at least one error;
    determining if the at least one error is correctable, the determining whether the at least one error is correctable includes,
       obtaining first hard-decision information for the selected chunk,
       determining if the at least one error is correctable based on the first hard-decision information,
       determining not to perform error correction on subsequent chunks of the page if the at least one error is determined to be uncorrectable based on the first hard-decision information, obtaining first soft-decision information for the selected chunk if the least one error is not correctable based on the first hard-decision information, determining if the at least one error is correctable based on the first soft-decision information, determining not to perform error correction on subsequent chunks of the page if the at least one error is determined to be uncorrectable based on the first soft-decision information, adjusting a read voltage if the at least one error is not correctable based on the first soft-decision information, obtaining second hard-decision information for the selected chunk using the adjusted read voltage, determining if the at least one error is correctable based on the second hard-decision information, determining not to perform error correction on subsequent chunks of the page if the at least one error is determined to be uncorrectable based on the second hard-decision information, obtaining second soft-decision information for the selected chunk if the at least one error is not correctable based on the second hard-decision information, and determining if the at least one error is correctable based on the second soft-decision information, and determining not to perform error correction on subsequent chunks of the page if the at least one error is determined to be uncorrectable based on the second soft-decision information.

* * * * *